(12) United States Patent
Zipper et al.

(10) Patent No.: US 7,263,336 B2
(45) Date of Patent: Aug. 28, 2007

(54) DEVICE, SYSTEM AND METHOD TO PROVIDE DIFFERENT BIAS VOLTAGES AND COMMON TUNING VOLTAGE

(75) Inventors: Eliav Zipper, Tel Aviv (IL); Meir Gordon, Holon (IL)

(73) Assignee: Marvell International Ltd., Hamilton (BM)

( * ) Notice: Subject to any disclaimer, the term of this patent is extended or adjusted under 35 U.S.C. 154(b) by 585 days.

(21) Appl. No.: 10/331,603

(22) Filed: Dec. 31, 2002

(65) Prior Publication Data
US 2004/0127167 A1    Jul. 1, 2004

(51) Int. Cl.
*H04B 1/40*    (2006.01)
*H04B 1/04*    (2006.01)
*H04B 1/18*    (2006.01)

(52) U.S. Cl. ............. 455/77; 455/119; 455/180.3; 331/36 C

(58) Field of Classification Search ............ 455/260, 455/262, 195.1, 77, 180.3, 119; 331/36 C, 331/177 R
See application file for complete search history.

(56) References Cited

U.S. PATENT DOCUMENTS

| | | | | |
|---|---|---|---|---|
| 3,976,944 A | * | 8/1976 | Kreng et al. | 455/196.1 |
| 5,059,892 A | * | 10/1991 | Stoft | 324/73.1 |
| 5,563,545 A | * | 10/1996 | Scheinberg | 327/389 |
| 5,740,523 A | * | 4/1998 | Nakajima et al. | 455/186.1 |
| 6,563,392 B2 | * | 5/2003 | Gomez et al. | 331/117 FE |

OTHER PUBLICATIONS

Salimi et al., "Linear OTAs for Continuous-Time Circuits: Oscillators and Filters", pp. 1-2.

Barrie Gilbert, "The MICROMIXE: A Highly Linear Variant of the Gilbert Mixer Using a Bisymmetric Class-AB Input Stage", IEEE Journal of Solid-State Circuits, vol. 32, No. 9, Sep. 1997, pp. 1412-1423.

* cited by examiner

*Primary Examiner*—Tilahun Gesesse

(57) ABSTRACT

In some embodiments of the present invention, multiple voltage controlled capacitor branches may be employed in a tuning circuit. Each of the multiple voltage controlled capacitors branches may be set to somewhat apart resonance frequency so that a composite resonance derivative curve forms an equi-ripple curve with an improved tuning sensitivity linearization.

19 Claims, 5 Drawing Sheets

DEVICE, SYSTEM AND METHOD TO PROVIDE DIFFERENT BIAS VOLTAGES AND COMMON TUNING VOLTAGE

BACKGROUND OF THE INVENTION

Phase Locked Loop (PLL) tuning circuitry is a common solution for stabilizing tuning frequency in Radio Frequency (RF) circuits. In order to maintain the frequency of a PLL circuit within very tight limits a calibration process may be carried out, which is able to compensate for variances in the electrical features of the tuning circuitry components over time and frequency. In particular, when the component used in the PLL circuit to change the PLL frequency is a voltage controlled capacitor (varactor), it may be desirable to compensate for the tuning sensitivity of the varactor to changes in its electrical features over frequency (also defined "tuning linearity"). For improved linearity in a tuning circuit it may be desirable to compensate the tuning linearity also for variance due to other factors, such as temperature.

Metal Oxide Semiconductor Field Effect Transistor (MOSFET) varactors (also known as MOSCAPs) are regarded as inferior to bi-polar varactors with respect to tuning linearity, yet MOSCAPs are generally capable of handling dual-polarity voltage swing while bi-polarity varactors are not generally capable of doing so.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
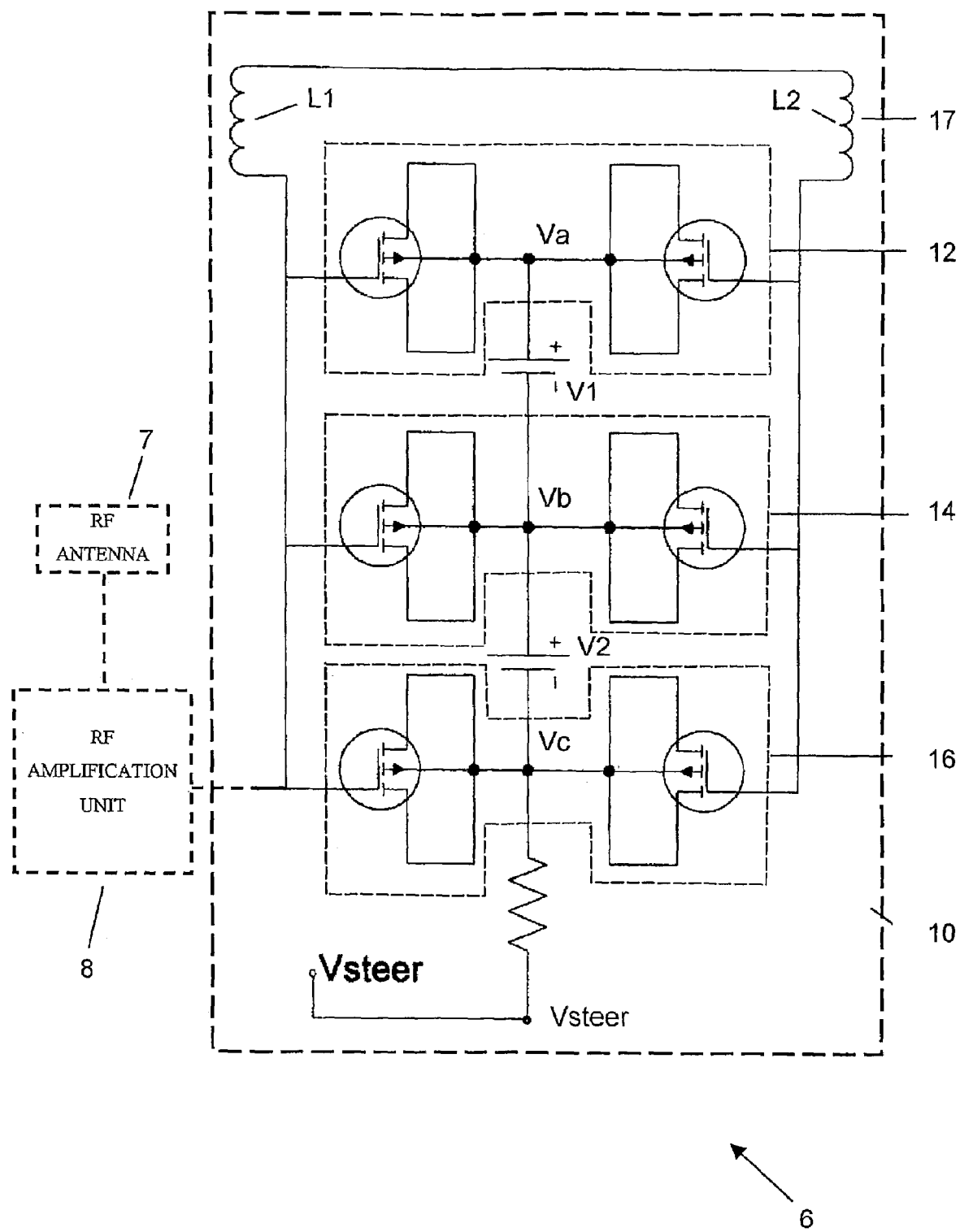
FIG. 1 is a simplified electrical diagram illustration of a compensated tuning circuitry constructed and working according to some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

It should be understood that the present invention may be used in a variety of applications. Although the present invention is not limited in this respect, the circuit disclosed herein may be used in many apparatuses such as in the receivers of a radio system. Radio systems intended to be included within the scope of the present invention include, by way of example only, cellular radiotelephone communication systems, two-way radio communication systems, one-way pagers, two-way pagers, personal communication systems (PCS), and the like.

Many high frequency analog circuits, such as filters and PLL tuning circuits are based on an Inductor/Capacitor (L/C) resonance or filtering loop. The filtering features of an L/C filter may be tunable, by changing the electrical properties of one or more of its electrical components, such as the capacitance of the capacitor (C) or the inductance of the inductor (L). Similarly, tuning circuits may have a tunable resonance frequency that may be changed by changing the electrical properties of one or more of its electrical components, such as the capacitance of the capacitor (C) or the inductance of the inductor (L). The linearity of a tuning circuit is determined mainly by the derivative of tuning frequency (also known as "Kvco") vs. tuning voltage. For better tuning linearity a constant ratio of tuning-frequency-to-tuning-voltage is required over as wide tuning voltage as possible. Thus, in a derivative-of-tuning-frequency vs. tuning voltage graph, where a flat portion of the graph represents a constant tuning-frequency-to-tuning-voltage ratio, the bigger the flat portion is, the wider is its tuning linearity range.

Figure 2:
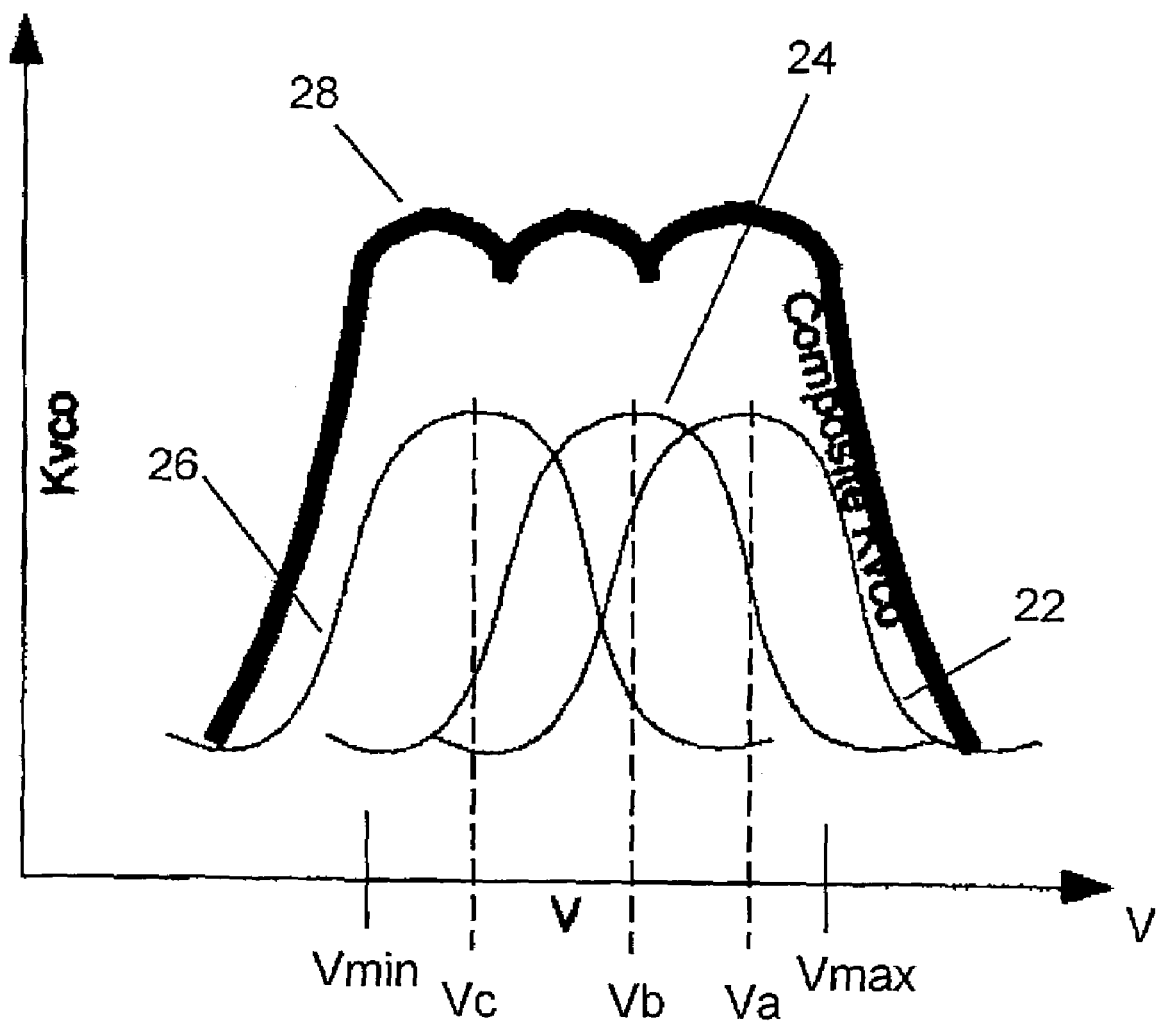
FIG. 2 is a schematic tuning frequency derivative versus control voltage graph of some embodiments of the present invention.

Reference is made now to FIG. 1, which is a simplified electrical diagram illustration of a tuning system 6 according to some embodiments of the present invention, and to FIG. 2, which is schematic derivative-of-tuning-frequency vs. control voltage graph 28 of some embodiments of the present invention. Tuning system 6 may comprise, for example, but not limited to, an RF antenna 7, an RF amplification unit 8 and a tuning circuit 10. RF antenna 7 may be of any desired kind such as, but not limited to, dipole, Yagi, multi-pole. Tuning circuit 10 may comprise two or more branches, each branch comprising at least one voltage controlled capacitor, such as a MOSCAP. Tuning circuit 10 may comprise also at least one branch comprising at least one inductor. In the particular example shown in FIG. 1, tuning circuit 10 comprises three capacitance branches denoted 12, 14 and 16 respectively. The voltage controlled capacitors in branches 12, 14 and 16 are of type MOSCAP, but may be of other types as well. Tuning circuit 10 comprises also one inductance branch denoted 17, with inductors L1 and L2. The working point of the gates of the MOSCAPs of branches 12, 14 and 16 may be biased to Va, Vb and Vc volts, respectively, where Va differs from Vb by V1 volts and Vb differs from Vc by V2 volts. A single control voltage terminal Vsteer may be used to control the tuning frequency of all three branches.

Each of the branches 12, 14 and 16 has its corresponding graph of the derivative of tuning frequency vs. tuning voltage denoted 22, 24 and 26 respectively. In graphs 22, 24 and 26 the pick points correspond to the working point voltages Va, Vb and Vc respectively. The combination of the three independent curves forms a composite curve 28. Composite curve 28 may have an enlarged portion that is substantially flat ranging from Vmin to Vmax. For a tuning voltage ranging between Vmin and Vmax, tuning circuit 10 may have an improved linearized tuning sensitivity. The curve demonstrates a substantially constant derivative-of-tuning-frequency graph, but in general, a designer might wish to achieve any tuning sensitivity profile that fits the system needs with this method.

Similarly, in a L/C analog filter (not shown) the filter properties, such as central frequency, shape of response curve, etc. may be controlled by applying biased voltages to different branches of the filter.

Figure 3:
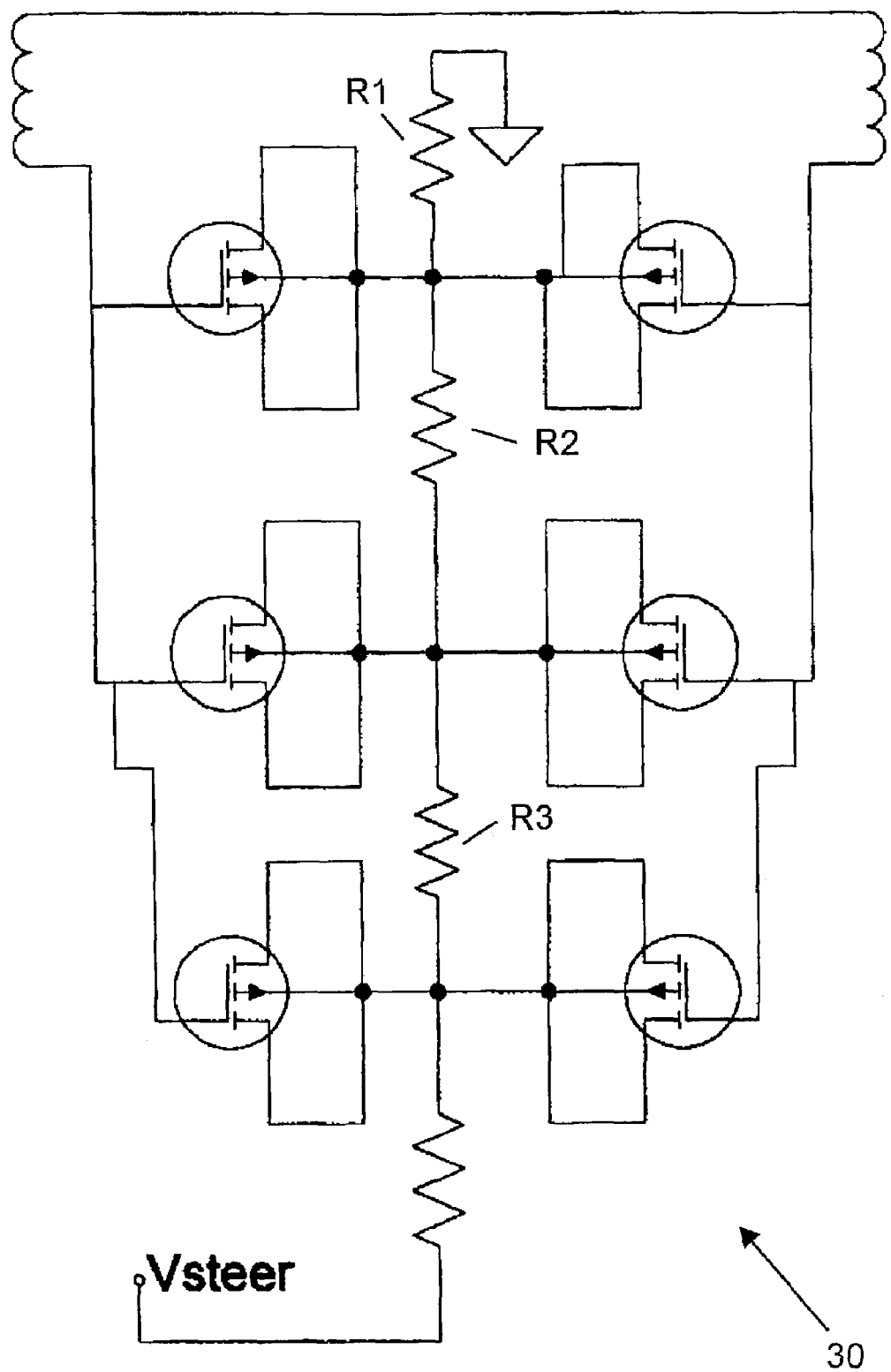
FIGS. 3 and 4 are schematic electrical diagrams of tuning circuits according to some embodiments of the present invention.
Figure 4:
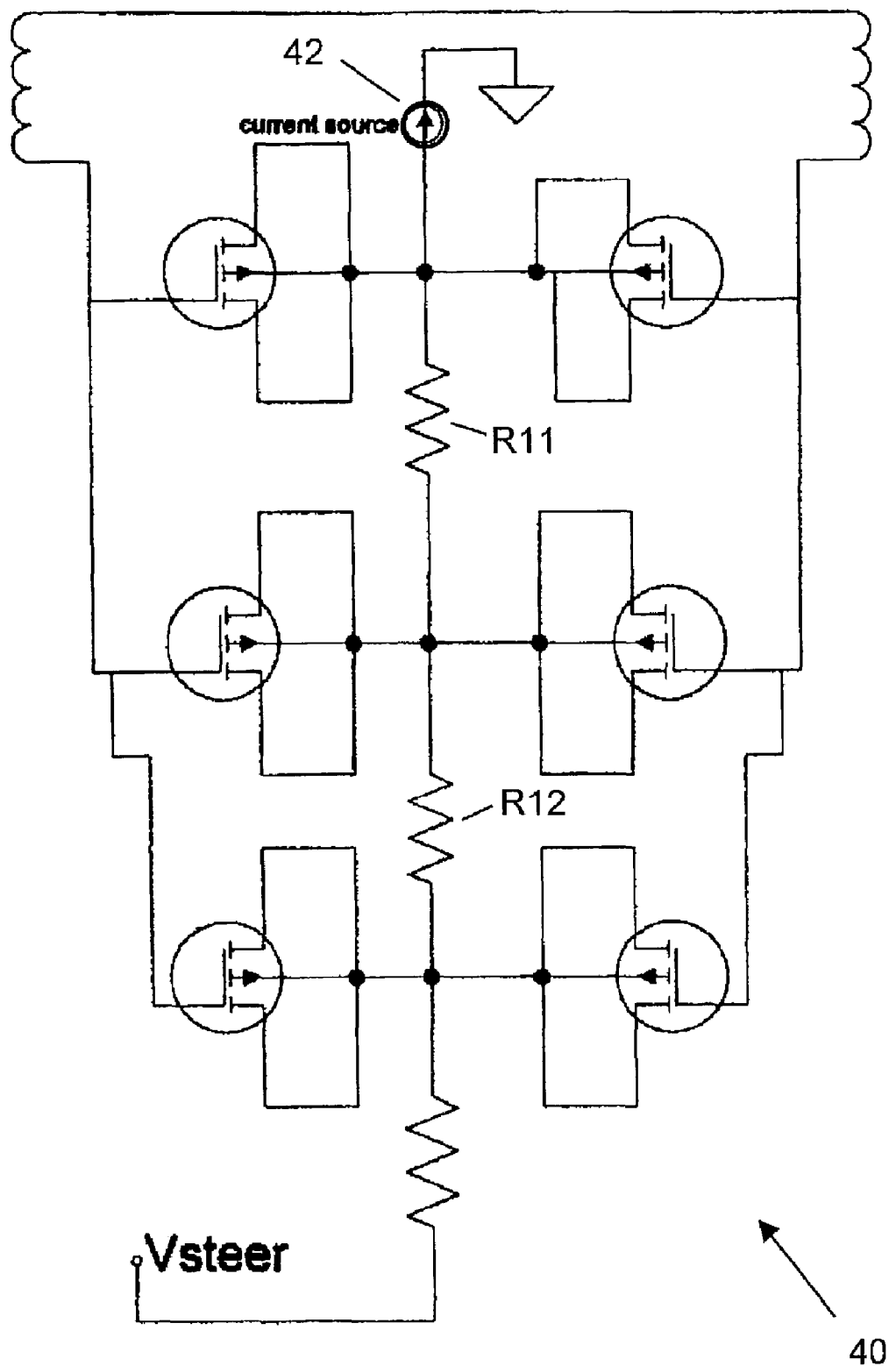

Reference is made now to FIGS. 3 and 4, which are schematic electrical diagrams of tuning circuits 30, 40 according to some embodiments of the present invention. Tuning circuit 30 is constructed and working according to some embodiments of the present invention. In order to set working point bias voltages for the various branches of tuning circuit 30, resistors R1, R2 and R3 may be used, arranged in a voltage splitter arrangement. Additionally, stabilizing shunt capacitors (not shown) may be placed over resistors R1, R2 and R3, in order to reduce variances in the voltage drop over R1, R2 and R3. In tuning circuit 40 a current source 42 may be added, in order to control the voltage drop over resistors R11, R12. It will be appreciated by persons of ordinary skill in the art that different arrangements and topologies may be used in order to set the voltage differences between the working points of the voltage-controlled capacitors in the various branches. It will also be appreciated that the number of branches comprising voltage-controlled capacitors may be two or more, and that the number of voltage controlled capacitors in a branch may be one or more. It will also be appreciated that the voltage controlled capacitors used in the linearized tuning circuit according to some embodiments may be other than MOS-CAP, such as but not limited to, bi-polar voltage-controlled capacitors.

Figure 5:
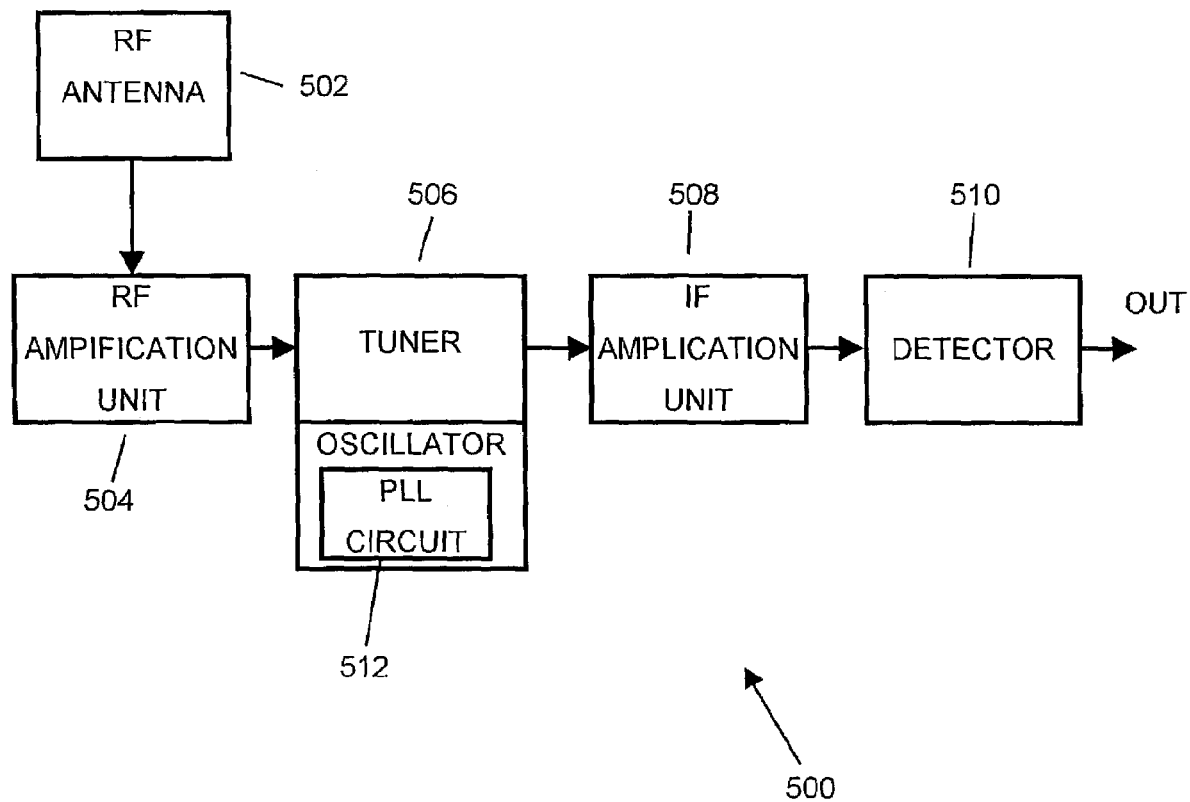
FIG. 5 is a high-level schematic block diagram illustration of a high frequency section in a radio receiver using the tuning circuitry of some embodiments of the present invention.

Reference is made now to FIG. 5, which is a high-level schematic block diagram illustration of a high frequency section in a radio receiver using tuning circuitry of some embodiments of the present invention. Radio frequency (RF) section 500 may comprise an RF antenna 502, a RF amplification unit 504, a tuner 506, an Intermediate Frequency (IF) amplification unit 508 and a detector 510. Tuner 506 may comprise an oscillator, which may comprise a PLL circuit 512 according to some embodiments of the present invention. It would be apparent to a person of ordinary skill in the art that the embodiments of the invention may be used in any other systems, where a voltage controlled capacitor is involved in controlling working frequency, or where it is desirable to shape the derivative-of-tuning-frequency vs. tuning voltage graph. These systems may comprise, but not limited to, RF receivers/transmitters, with or without a connection to antenna, RF amplifiers and RF filtering systems.

It will be appreciated by persons of ordinary skill in the art that according to some embodiments of the present invention other L/C analog circuits, such as, but not limited to, filters may comprise two or more branches each comprising at least one voltage controlled capacitor, where the working point of one voltage controlled capacitor is shifted from that of any other voltage controlled capacitor, to control the response features of that circuit.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising:
providing different bias voltages to at least first and second, different, branches of voltage-controlled capacitors in a tuning circuit, by passing a current through a voltage splitter arrangement having a plurality of resistors, and
providing a common tuning voltage to said different branches to shift a working point of a gate of a first voltage controlled capacitor of said first branch relative to a working point of a gate of a second voltage controlled capacitor of said second branch.

2. The method of claim 1, wherein said voltage-controlled capacitors are metal-oxide semiconductor field-effect-transistor voltage-controlled capacitors.

3. The method of claim 1, further comprising providing different bias voltages to achieve a desired derivative-of-tuning-frequency of a tuning voltage graph of said tuning circuit.

4. The method of claim 3, comprising providing different bias voltages to achieve an equi-ripple derivative-of-tuning-frequency of said tuning voltage graph.

5. The method of claim 1 further comprising providing said different bias voltages evenly shifted from each other.

6. The method of claim 1 further comprising providing said different bias voltages to compensate for temperature variance in said tuning circuit.

7. A tuning circuit comprising:
a first branch comprising an inductor;
a second and a third branches,
wherein the second branch comprises a first voltage controlled capacitor and biased by a first bias voltage and the third branch comprises a second voltage controlled capacitor and biased by a second bias voltage; and
a voltage splitter arrangement having a plurality of resistors to provide said first and second bias voltages; and
a control voltage terminal common to said three branches, wherein the control voltage terminal is to shift a working point of a gate of said first voltage controlled capacitor relative to a working point of a gate of said second voltage controlled capacitor.

8. The tuning circuit of claim 7 wherein said second and third branches are provided with a common tuning voltage.

9. The tuning circuit of claim 7 wherein said voltage controlled capacitors are metal-oxide semiconductor field-effect-transistor voltage controlled capacitors.

10. The tuning circuit of claim 7, wherein said bias voltages are selected to achieve a desired derivative-of-tuning-frequency to—said of a tuning voltage graph of said tuning circuit.

11. The tuning circuit of claim 10, wherein said bias voltages are selected to achieve an equi-ripple derivative-of-tuning-frequency of said tuning voltage graph.

12. The tuning circuit of claim 7, wherein said bias voltages are evenly shifted from each other.

13. The tuning circuit of claim 7, wherein said bias voltages are evenly shifted from each other, and wherein said tuning circuit is in operable connection with an amplification unit.

14. The tuning circuit of claim 7, wherein said voltage controlled capacitors are metal-oxide semiconductor field-effect-transistor voltage-controlled capacitors, and wherein said tuning circuit is in operable connection with an amplification unit.

15. The tuning circuit of claim 7, wherein said voltage controlled capacitors are metal-oxide semiconductor fieldeffect-transistor voltage controlled capacitors, and wherein said tuning circuit is a tuner unit tuning circuit.

16. The tuning circuit of claim 7, wherein said voltage controlled capacitors are provided with common tuning voltage.

17. A filter comprising:
  at least one inductor device,
  a voltage splitter arrangement having a plurality of resistors to provide first and second bias voltages, and
  at least first and second branches each having at least one voltage controlled capacitor, and
  a control voltage terminal common to said at least first and second branches,
  wherein the control voltage terminal is to shift a working point of a gate of a first voltage controlled capacitor of the first branch relative to a working point of a gate of a second voltage controlled capacitor of a second branch,
  wherein said first and second voltage controlled capacitors are biased by said first and second bias voltages, respectively.

18. The filter of claim 17, wherein said at least two branches are provided with the same tuning voltage.

19. The filter of claim 17, wherein said voltage controlled capacitors are metal-oxide semiconductor field-effect-transistor voltage controlled capacitors.

* * * * *

UNITED STATES PATENT AND TRADEMARK OFFICE
CERTIFICATE OF CORRECTION

PATENT NO.       : 7,263,336 B2
APPLICATION NO.  : 10/331603
DATED            : August 28, 2007
INVENTOR(S)      : Zipper et al.

Page 1 of 1

It is certified that error appears in the above-identified patent and that said Letters Patent is hereby corrected as shown below:

Drawings.
Fig. 5
...AMPIFICATION...504 should be AMPLIFICATION ...504

...AMPLICATION ....508 should be AMPLIFICATION ....508

Column 4
Lines 23 & 25, "...claim 1 further..." should read --...claim 1, further...--.

Lines 43 & 45, "...claim 7 wherein..." should read --...claim 7, wherein...--.

Signed and Sealed this

Seventh Day of October, 2008

JON W. DUDAS
*Director of the United States Patent and Trademark Office*